United States Patent
Witte et al.

(10) Patent No.: US 8,416,092 B2
(45) Date of Patent: Apr. 9, 2013

(54) DEVICE FOR TRIGGERING FUNCTIONS IN A VEHICLE

(75) Inventors: Martin Witte, Ahaus (DE); Dirk Mueller, Essen (DE); Andreas Peschl, Velbert (DE)

(73) Assignee: HUF Hülsbeck & Fürst GmbH & Co. KG, Velbert (DE)

(*) Notice: Subject to any disclaimer, the term of this patent is extended or adjusted under 35 U.S.C. 154(b) by 0 days.

(21) Appl. No.: 12/452,244

(22) PCT Filed: Apr. 11, 2008

(86) PCT No.: PCT/EP2008/003083
§ 371 (c)(1),
(2), (4) Date: Dec. 21, 2009

(87) PCT Pub. No.: WO2009/000355
PCT Pub. Date: Dec. 31, 2008

(65) Prior Publication Data
US 2010/0134307 A1 Jun. 3, 2010

(30) Foreign Application Priority Data
Jun. 22, 2007 (DE) .......................... 10 2007 028 898

(51) Int. Cl.
*G08B 21/00* (2006.01)
(52) U.S. Cl.
USPC .................. 340/665; 340/5.72; 292/336.3
(58) Field of Classification Search ............ 340/665, 340/426.28, 5.62, 5.72; 292/336.3
See application file for complete search history.

(56) References Cited

U.S. PATENT DOCUMENTS

| | | | |
|---|---|---|---|
| 7,057,124 B2* | 6/2006 | Ieda et al. ............... | 340/5.72 |
| 7,331,618 B2* | 2/2008 | Jooss et al. .............. | 292/336.3 |
| 7,576,631 B1* | 8/2009 | Bingle et al. ........... | 340/5.72 |
| 2006/0143857 A1* | 7/2006 | Freyholdt et al. ...... | 340/426.28 |
| 2006/0232378 A1* | 10/2006 | Ogino et al. ............ | 340/5.72 |
| 2008/0079537 A1* | 4/2008 | Touge ..................... | 340/5.72 |
| 2010/0007463 A1* | 1/2010 | Dingman et al. ...... | 340/5.72 |

FOREIGN PATENT DOCUMENTS

| | | |
|---|---|---|
| DE | 10212768 | 6/2003 |
| DE | 10221511 | 11/2003 |
| DE | 102004019571 | 11/2005 |
| DE | 102005055515 | 2/2007 |
| DE | 102005046542 | 7/2007 |
| EP | 1512814 | 3/2005 |

* cited by examiner

*Primary Examiner* — John A Tweel, Jr.
(74) *Attorney, Agent, or Firm* — Horst M. Kasper

(57) ABSTRACT

Two sensors (20, 30) which cooperate with one another are used in the interior of an activator (10) in order to trigger functions in a vehicle, said sensors (20, 30) being a proximity sensor (20) with a capacitive electrode (21) and a pressure sensor (30) with a pressure measuring element (31). The intention is that the pressure measuring element (31) will be acted on when pressure is applied manually (44) to an application point (43) on the outside of the actuator (10). It is proposed that in order to improve the method of functioning that the electrode (21) of the proximity sensor (20) be provided with a breakthrough (22) and that the pressure transmission between the application point (43) on the actuator (10) and the pressure measuring element (31) be lead through the breakthrough (22) in the electrode (21). The space between the application point (43) and the pressure measuring element (31) is spanned by a pressure transmitting means (50) which passes through the breakthrough (22). The functioning of the proximity sensor (20) is not hampered just as the functioning of the pressure measuring element (31) is unimpeded.

25 Claims, 4 Drawing Sheets

DEVICE FOR TRIGGERING FUNCTIONS IN A VEHICLE

CROSS-REFERENCE TO RELATED APPLICATIONS (not applicable)

Figure 1:
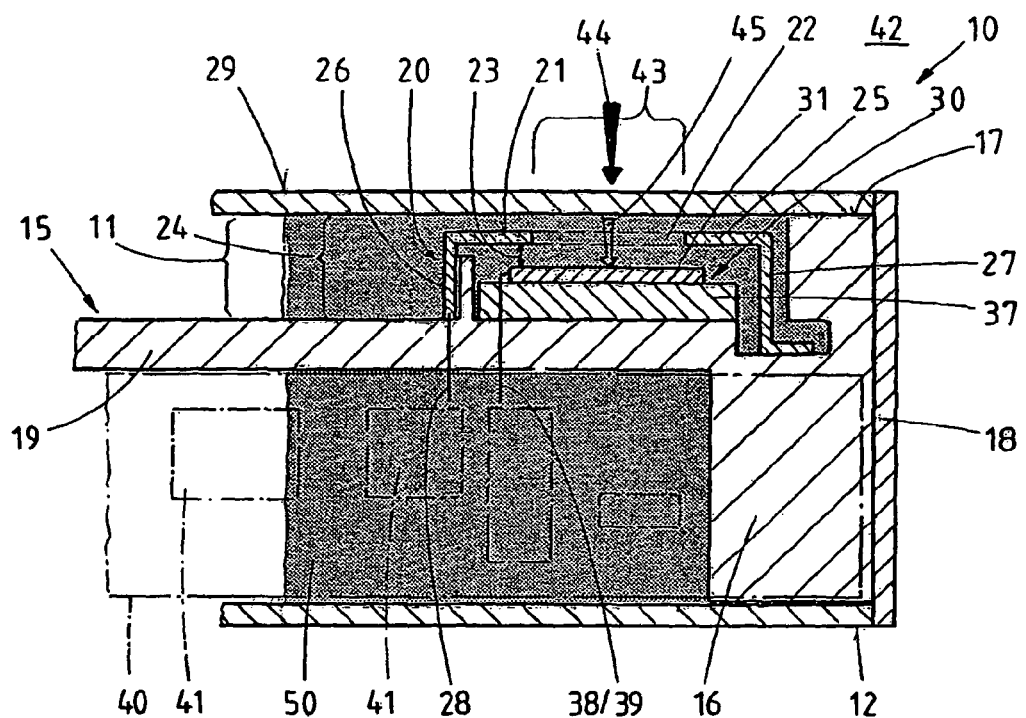

STATEMENT REGARDING FEDERALLY SPONSORED RESEARCH OR DEVELOPMENT (not applicable)

THE NAMES OF THE PARTIES TO A JOINT RESEARCH AGREEMENT (not applicable)

INCORPORATION-BY-REFERENCE OF MATERIAL SUBMITTED ON A COMPACT DISC (not applicable)

BACKGROUND OF THE INVENTION (1) Field of the Invention

The invention is directed to a device of the kind given in the preamble of claim 1. The proximity sensor and the pressure sensor cooperate. The signals coming from them are evaluated together in the control apparatus and are led to a common output signal, which serves for controlling the desired functions in a vehicle.

(2) Description of Related Art

The German printed Patent document DE 10 2004 019 571 A1 shows a known device of this kind. A piezo element operates here as a pressure measurement member, which piezo element is directly turned toward the point of attack of the handle, in order to be subjected to pressure by a tappet furnished at the point of attack in case of an actuation. This piezo element is carried by an electrode, wherein the electrode is directed away relative to the outer point of attack of the actuator. The buildup of the electric field is interfered with by the proximity sensor through the piezo element lying thereon.

The German printed Patent document DE 10 2005 046 542 A1 shows a device, wherein the piezo element is disposed between two electrodes of the proximity sensor as a dielectric. Here the electrodes shield the piezo element relative to the outer point of attack at the actuator. Thereby an interference free mode of operation of the piezo element is not any longer certain.

BRIEF SUMMARY OF THE INVENTION

It is an object of the present invention to develop a reliable device of the kind indicated in the preamble of claim 1, which is space saving and where the effects of the proximity sensor and of the pressure sensor are not hindering each other mutually. This is accomplished by the features recited in claim 1, wherein the features have the following particular importance.

Even though the electrode of the proximity sensor can in certain cases be disposed in front of the pressure measurement member of the pressure sensor relative to the outer point of attack at the actuator, the pressure measurement member is not shielded, since the electrode exhibits a breakthrough in alignment with the pressure measurement member. This breakthrough is disposed in the path of the pressure transfer between the outer point of attack of the actuator and the pressure measurement member. The pressure measurement member is in this case disposed in a plane, which plane—relative to the point of attack of the actuator—is disposed below the breakthrough.

However, is also possible to place the pressure measurement member in the plane, in which plane is located the electrode with its breakthrough. In certain cases the plane for the pressure measurement member could also be located in front of the breakthrough of the electrode. The electrode like a frame surrounds in both cases the pressure measurement member positioned in alignment with the breakthrough. A pressure exertion in the region of the point of attack of the actuator this way passes over a large area through the breakout up to the pressure measurement member.

The pressure transfer agent can be formed bodily and for example consist of a tappet. In this case the tappet is positioned in the region of the point of attack of the actuator with its one end, for example at the inner wall of the actuator, while the operating end is directed toward the pressure measurement member through the breakthrough. Such a tappet formed as a cone is recommended for an amplification of the pressure transfer obtained by focusing, wherein the large face base plane of the cone is turned toward the point of attack, while the narrowing end of the cone is directed toward the pressure measurement member.

Alternatively or additionally to the recited pressure transfer agents there can be furnished for this purpose also a medium, which fills the space between the point of attack, the breakthrough in the electrode and the pressure measurement member. Such a medium can also by itself be yielding elastically. It is recommended to form the medium incompressible in itself for obtaining a good transfer of the pressure. It is particularly simple to employ a casting mass as a medium, wherein the casting mass fills fully or in part the receiver in the actuator.

The steps of the invention effect that the effect of the electrode toward the outside is not shielded by the pressure measurement member and that the pressure measurement member on its side stands in effective connection through the breakthrough in the electrode immediately with the pressure transfer path up to the outer attack point of the actuator. Since the breakthrough is employed for the pressure transfer, vice versa also the electrode does not interfere with the operational effect of the pressure measurement member.

Further steps and advantages of the invention result from the further claims, the description and the drawings. An embodiment example of the invention is shown in part schematically and in part concrete. There is shown in:

BRIEF DESCRIPTION OF THE SEVERAL VIEWS OF THE DRAWING(S)

Figure 2:
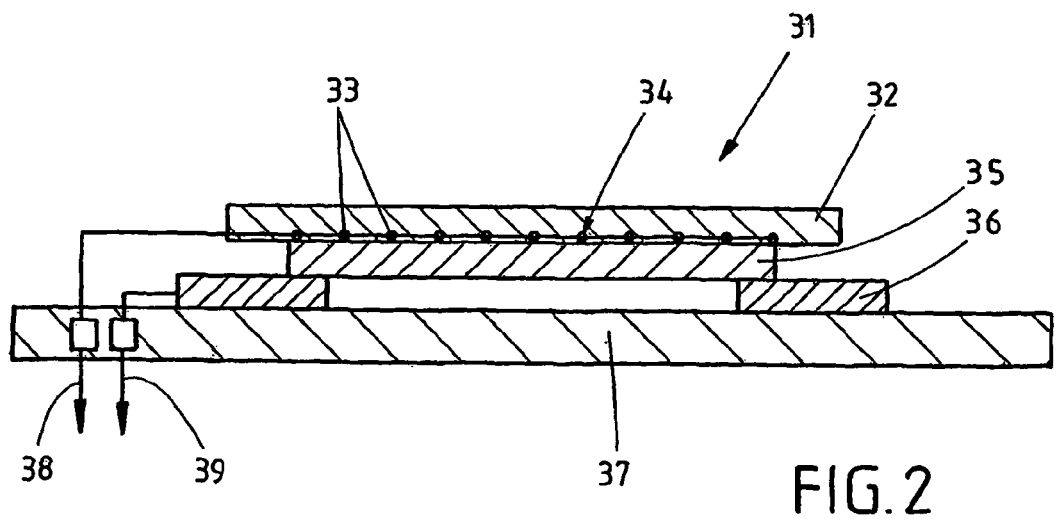
Figure 3:
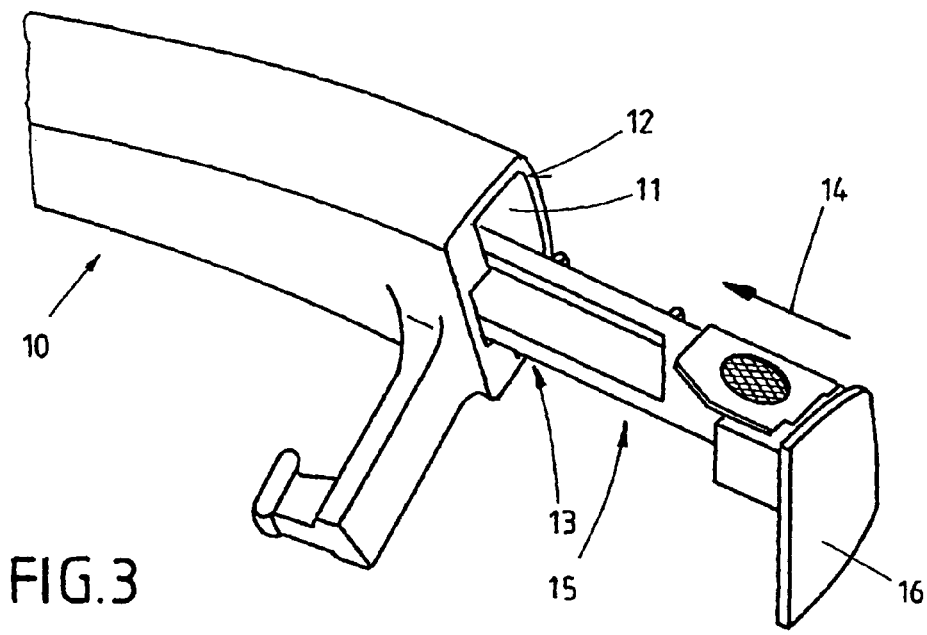
Figure 4:
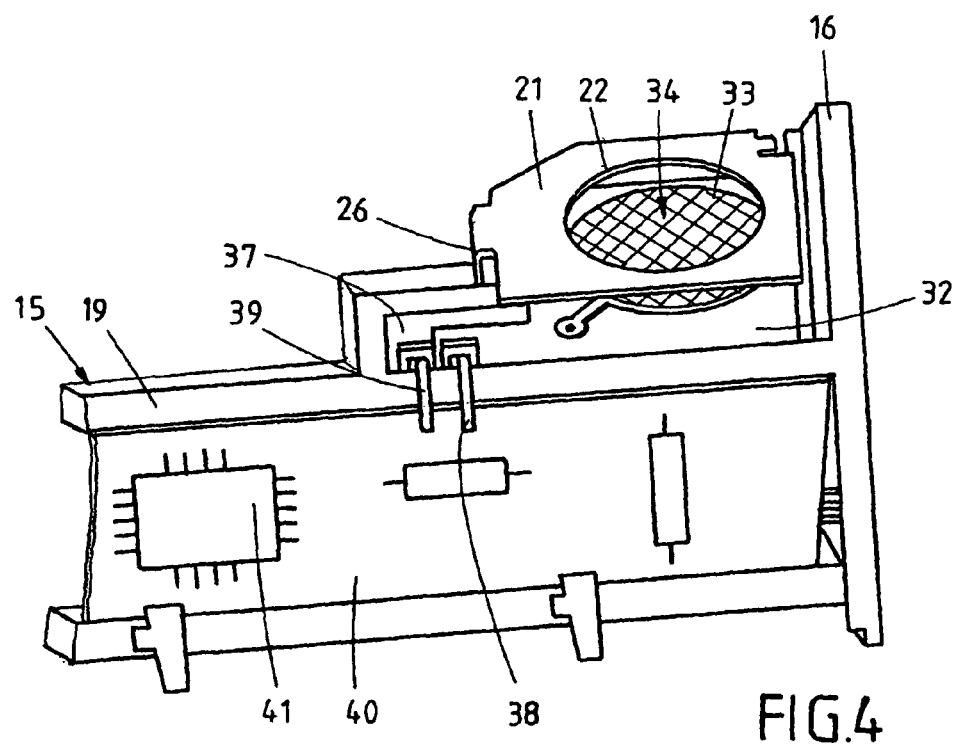
Figure 5:
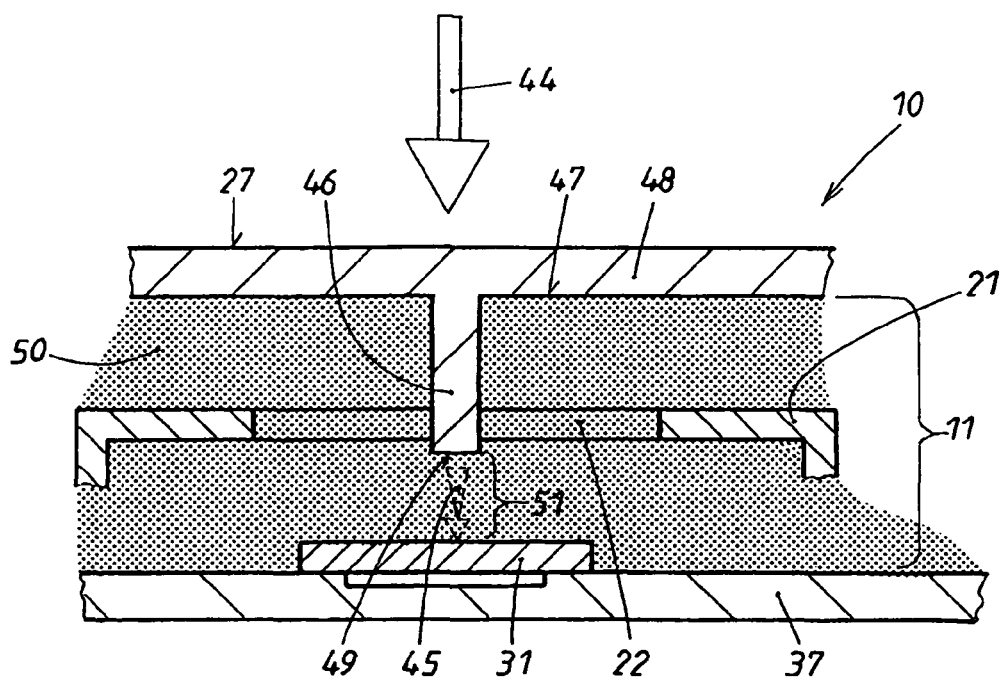
Figure 6:
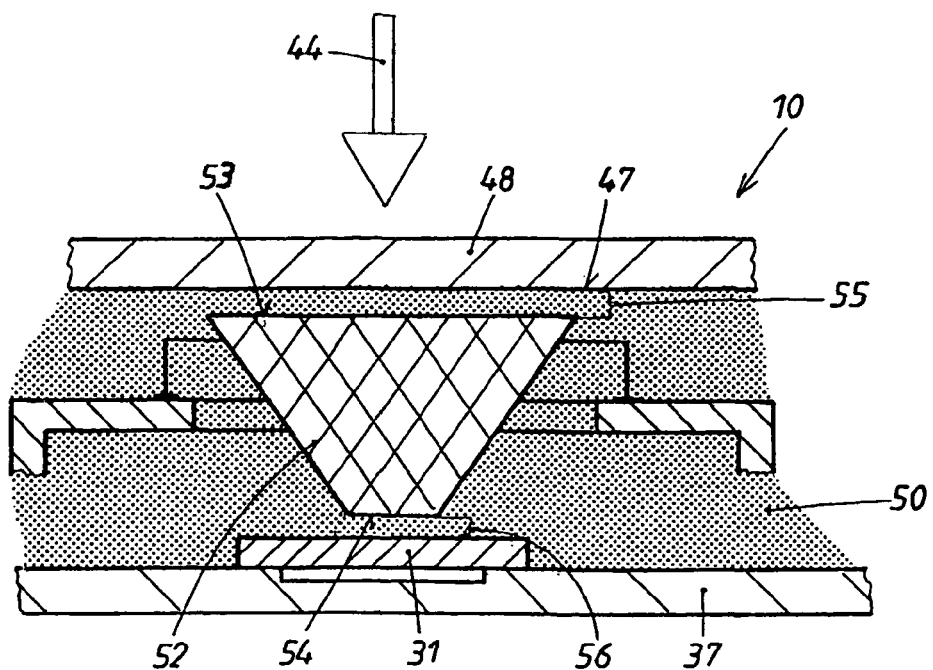
Figure 7:
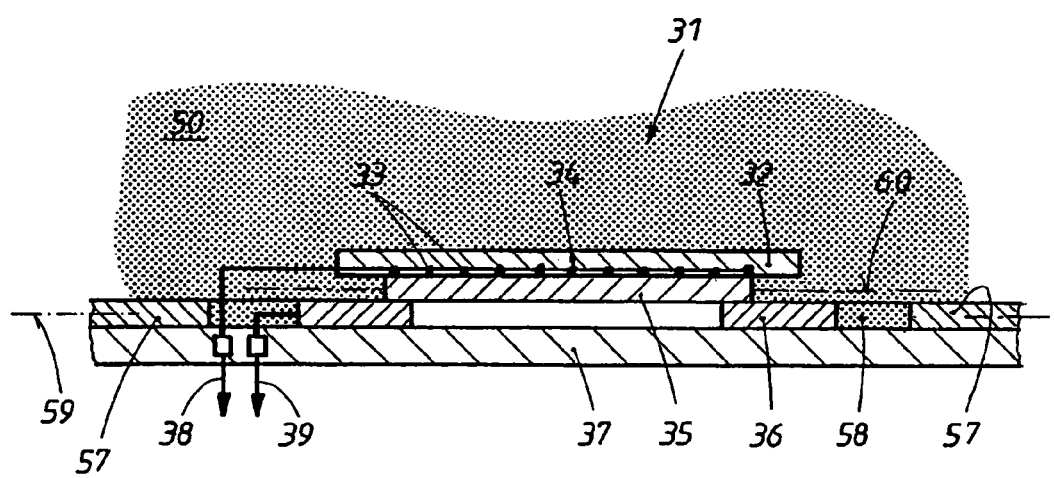

FIG. 1 a schematic longitudinal section through an actuator into which the invention device is integrated, FIG. 2 a schematic longitudinal sectional view through the pressure measurement member employed in the invention device, FIG. 3 view of a part piece of a concrete actuator, wherein an insert belonging to the invention is partially pulled out from the actuator, FIG. 4 shows a part piece of the insert shown in FIG. 3 prior to the incorporation of the part piece into the actuator of FIG. 3, FIG. 5 shows schematically a part piece of a first alternative embodiment to FIG. 1 of the invention device, FIG. 6 shows a second alternative of this device, and FIG. 7 shows a third alternative of the invention device with employing the construction recognizable in FIG. 2.

DETAILED DESCRIPTION OF THE INVENTION

A handle for actuating of a lock in a vehicle not shown in detail serves as an actuator 10 for triggering of functions in a vehicle. The actuator 10 has a receiver 11, for example in the shape of a bore hole, wherein the opening 13 of the bore hole is disposed at the one end 12 of the handle 10.

The actuator (10) is a handle for a door of the vehicle and wherein the receiver in the handle consists of a blind pocket hole (11), wherein the opening (13) of the blind pocket hole (11) is turned toward the one end (12) of the handle and wherein the equipped insert (15) is insertable into the interior of the handle (10) through the opening (13) of the blind pocket hole.

An insert 15 in the sense of the arrow 14 recognizable from FIG. 3 can be inserted through this opening 13 into the interior of the actuator 10. The insert 15 has a stopper 16 at its outer end, wherein the stopper 16 closes the opening of the bore hole 11 in the plug in situation according to FIG. 1, and supports itself on the circumference at the inner faces 17 of the bore hole. The insert (15) has a stopper (16) in the region of the opening (13) of the blind pocket hole (11) and wherein the stopper (16) at least partially closes the opening (13) of the blind pocket hole (11) in case of insertion and wherein the stopper (16) supports itself circumferentially at least point wise at the inner face (17) of the receiver (11). A cover 18 recognizable from FIG. 1 can conclude the handle end 12 on the outer side of the stopper 16. Such a cover 18 should be adapted with respect to material and color to the outer face of the actuator 10.

The insert 15 has a support wall 19 extending in the course direction of the handle. A printed circuit board 40 is attached at at least one side of this support wall 19, wherein the printed circuit board 40 exhibits a conductor path for schematic indicated electronic device components 41. The device components 41 are coordinated to various sensors 20, 30, and communication apparatus for the vehicle. These device components have in principle the following construction and the operational effect described in the following. An additional capacitive element can be disposed on the oppositely disposed side of this support wall 19, wherein the capacitive element can belong to an electronic closure system.

The actuator 10 is a component of this electronic closure system, which for example serves for unbolting and/or locking of the already recited lock at a door or flap of the vehicle. The actuator 10 is then a handle of the door or of the flap and consists of a so-called pulled handle as shown by way of parts in FIG. 3. The handle in case of a manual actuation is also used for the mechanical opening of the lock. This electronic closure system is controlled both by a remote effect as well as also by a manual pressure actuation, wherein two together cooperating sensors 20, 30 are provided in the interior of the actuator 10. In the present case the sensors 20, 30 serve for bolting the lock, while the previously recited additional capacitive element, which is not shown in detail, is employed for opening of the closure system.

If an authorized person approaches the vehicle or, respectively, the hand of the authorized person does, then initially during the so-called "keyless entry", a testing of the access authorization takes place. The authorized person is in fact in possession of an identification donor, which shall be called in the following "ID-donor". An identification taker entering into communication already at a distance, is coordinated to this ID-donor in the vehicle, wherein correspondingly the identification taker is designated as "ID-taker". A mono or bidirectional communication takes place between the ID-donor and the ID-taker upon approach of the authorized person, and wherein the communication effects the recited unbolting or bolting of the lock in a successful case. This communication is triggered by a proximity sensor 20 in the present case, wherein at least the following device components, disposed in the interior of the actuator 10, belong to the proximity sensor 20.

The proximity sensor 20 comprises a capacitive electrode 21, wherein the capacitive electrode 21 builds up an electric field in the outer space 42 around the actuator 10. If the hand of the authorized person passes into this electrical field, the electrical device components belonging to the proximity sensor 20 determine a capacitive change, wherein the capacitive change is transmitted to an electrical control apparatus. At least some of these device components of the proximity sensor 20 and of the control apparatus can also be disposed in the interior of the actuator 10. A bolting of the lock takes place upon successful communication for example as already recited.

After the manual actuation, thus a motor driven closure of the lock takes place within a defined time span. A pressure sensor 30 participates in the triggering of the closure motion of the lock, wherein at least one pressure measurement member 31 of the pressure sensor 30 is also disposed in the interior of the actuator 10, and in fact in a particular combination with the previously recited electrode 21 of the proximity sensor 20.

The operational effect of the pressure sensor 30 is triggered when a pressure in the sense of the force arrow 44 is exerted at a predetermined attack position characterized with the reference character 43 in FIG. 1. In fact the electrode 21 of the proximity sensor 20 is disposed below this point of attack 43, however the electrode 21 has a breakthrough 22 at this position. The pressure measurement member 31 of the pressure sensor 30 is disposed below the breakthrough 22 at a distance 23. In addition at least the space 24 is filled with an yielding casting mass 50, wherein the casting mass 50 fills the complete receiver 11 in the present case. This casting mass 50 is filled into the interior of the actuator 10 after incorporation of the equipped insert 15. The casting mass 50 therefore is present on a path marked with the arrow 45, wherein a pressure 44 exerted at the point of attack 43 passes through the breakthrough 22 in the electrode 21 up to the pressure measurement member 31 and thereby sets the pressure sensor 30 active.

The electrode 21 of the proximity sensor 20 consists of an essentially U-shaped angled sheet metal section according to the first embodiment example as seen in a cross-sectional view and as best seen from FIG. 1. This U-shape can be subdivided into two U-legs 26, 27, wherein the two U-legs 26, 27 are connected to each other by way of a U-middle web 25. The breakthrough 22 is disposed in the U-middle web 25. The ends of the two U-legs 26, 27 are supported at the one side of the support wall 19 by the insert 15, for example the U-leg 26 is contacted with the conductor path of the circuit board 40 and with the associated electrical device components 41 by the insert 15 through electrical connections 28. As shown in FIG. 1, the pressure measurement member 31, which is there in FIG. 1 only schematically indicated, is disposed in the U-interior region between the two legs 26, 27 and the U-middle web 25. The already recited distance 23 can here exist. It can be recognized from presentation in FIG. 2 how such a pressure measurement member 31 can look.

The pressure measurement member consists out of the device unit 31 according to FIG. 2 containing several device components. Initially a conductor foil 32 belongs to the device unit 31, wherein the conductor foil 32 is directed toward the breakthrough 22 of the electrode 21 and therefore initially has to receive the pressure transfer 45. As can concretely be recognized in FIG. 4, the conductor foil 32 has a grid work 34 made out of electrically conducting rods 33, which contact with a piezo element 35 disposed below the conductor foil 32. The piezo element 35 is seated on the annular spacer 36, wherein the annular spacer 36 contacts electrically the piezo element 35 on the oppositely disposed side. These device elements 32, 35, 36 are pre-mounted on a carrying plate 37. Contacts or, respectively, electrical connectors 38, 39 start out from the carrying plate 37, wherein the contacts or, respectively, the electrical connectors 38, 39 are connected with the already recited electrical paths of the circuit board 40. The carrying plate 37 can also have integrated electrical paths for the connection of the conducting grid work 34 and the spacer 36. The carrying plate 37 is therefore designated as "Print".

The steps recited in claim 25 have a proper inventive importance, wherein the steps are to be considered as an alternative to the steps recited in claim 1. In this case the grid work 34 is at the same time used for the purpose in the conductor foil 32 of the pressure measurement member 31 in order to effect the functions of an electrode of a proximity sensor. A corresponding preparation of the electrical field generated by the grid work 34 is necessary, which field responds to the approaching of a person. The previously described electrode 21 with its breakthrough 22 can be dispensed within this alternative, because this task is already taken care of by the grid work 34. The mesh openings operate as a plurality of breakthroughs, which breakthroughs allow the pressure actuating forces to pass to the piezo element 35. The grid work 34 is also in itself bendable based on its geometrical structure which favors the pressure transfer up to the piezo element 35.

It is to be understood that instead of the grid work 34 also a different arrangement of the important conductor rods 33 in the conductor foil 32 could be arranged, namely for example in the form of a family of electrical conductors disposed next to each other, wherein the electrical conductors are connected to each other in a different way as by crossing conductor rods. A wound double spiral of electrical conductors is for example suitable for this purpose, wherein the individual windings can move away from each other in their radial distances without further problem upon rotation of the conductor foil 32 during a pressure exertion 44. The grid work could finally also be formed as a meander.

The interior 11 of the actuator 10 could also be filled with another material instead of the casting mass 50, for example of material with a grain structure. It is important that an exertion of pressure 44 passes up to the pressure measurement member 31 through the above described path 45. Therefore also massive elements could be arranged in the region of the path 45, wherein the massive elements grip through the breakthrough 22 of the electrode 21 and this way take care of the pressure transfer 45. Examples for the situation are illustrated schematically in FIGS. 5 and 6, wherefrom the following construction results.

FIG. 5 shows schematically and in enlarged form an upper region of the device of the present invention in a first alternative to FIG. 1. The FIG. 6 shows the same region according to a second alternative, while FIG. 7 illustrates a third alternative of the invention by way of the FIG. 2. While the same reference characters as in the first embodiment example of FIG. 1 and FIG. 2 are employed in these alternative embodiments according to FIGS. 5 through 7, therefore to some extent initially the previous description holds. Therefore it is sufficient to describe only the differences of these three alternatives to the first embodiment example of FIGS. 1 and 2.

A medium illustrated by point hatching is in fact also present in the receiver 11 according to FIG. 5, however a tappet 46 serves as a further essential pressure transfer means, wherein the tappet 46 is seated on the foot side at the inner face 47 of said yielding wall 48, which yielding wall 48 generates the already above recited outer side 27 of the actuator 10. The free work end 49 of the tappet is aligned with the pressure measurement member 31. The tappet 46 passes through the breakthrough 22 of the electrode 21. Upon a pressure exertion 44, the pressure over the tappet 46 is continued in the sense of the pressure transfer path 45 through a layer designated with reference character 51 of the local medium 50.

The second embodiment example of FIG. 6 has a similar construction. Here a conical element 52 operates as a tappet. The conical element 52 is turned with its large area cone basis 53 to the above described inner face 47 of the handle 10. The narrowing cone end 54 is directed toward the pressure measurement member 31, wherein the pressure measurement member 31 rests on a support 37 or on a circuit board. Layers 55, 56 of a medium 50 furnished also in this situation can be disposed above and/or below this cone element 52 and the layers 55, 56 can thereby participate at the pressure transfer. The conical element 52 acts during the pressure exertion 44 as a pressure amplifier, since the cone element 52 collects the load impinging on its large cone basis 53 and concentrates and therefore amplifies at its narrow end 54 transfers onto the pressure measurement member 31. The device of FIG. 6 is therefore particularly good pressure sensitive and thereby safe in its functioning.

The situation illustrated already by way of FIG. 2 is present in the third embodiment example of FIG. 7. The feature comprises that the pressure measurement member 31 with its various elements is enveloped like a frame by an electrode 57 of a proximity sensor not shown in detail. Also in this case, the electrode 57 exhibits thus the previously described breakthrough 58, wherein the pressure measurement member 31 is disposed in the breakthrough 58. In the present case the electrode 57 is arranged on the already in connection with FIG. 2 described support plate 37 or at an analogous circuit board. The carrier plate 37 is therefore carrier both of the electrode 57 as well as of the pressure measurement member 31, without that these two sensors interfere against each other.

The decisive element of the pressure measurement member 31, that is the piezo element 35, is disposed in the plane 60 emphasized by point hatching according to the third embodiment example of FIG. 7. Also the analogous plane of the electrode 57 is drawn in FIG. 7 through a dash—dotted line 59. As can be taken from the comparison of the planes 60, 59, even the plane 60 of the pressure measurement member can be positioned somewhat in front of the electrode 57. The position of the planes 59, 60 is consequently not important, even though the construction according to FIGS. 1 through 6 has proven to be particularly good.

List of reference characters 10 actuator, door handle
11 receiver, bore hole
12 first end of 10
13 opening of 11
14 arrow of the insertion motion of 15
15 insert
16 stopper of 15

17 inner face of 16
18 cover for 13 at 15
19 support wall of 15 for 20, 30, 40
20 proximity sensor
21 electrode of 20
22 breakthrough in 21
23 distance between 21, 31 (FIG. 1)
24 space between 43, 22, 31 (FIG. 1)
25 U-middle web of 21 (FIG. 1)
26 first U-leg of 21 (FIG. 1)
27 second U-leg of 21 (FIG. 1)
28 electrical connection between 26 and 40 (FIG. 1)
29 outer side of 10 (FIG. 1)
30 pressure sensor
31 pressure measurement member of 30, device unit
32 conductor foil of 31 (FIG. 2)
33 conductor rod in 32 (FIGS. 2, 3)
34 grid work from 33 (FIGS. 2, 3)
35 piezo element (FIG. 2)
36 spacer (FIG. 2)
37 support plate, print (FIGS. 1 through 3)
38 electrical connector for 33, 34 (FIG. 2)
39 electrical connector for 36 (FIG. 2)
40 circuit board
41 electrical device components for 20, 30
42 outer space of 10 for electrical field
43 point of attack at 10
44 force arrow of the pressure exertion on 43 (FIG. 1)
45 force transfer path (FIG. 1)
46 tappet (FIG. 5)
47 inner face of 48 (FIG. 5)
48 wall of 10 (FIG. 5)
49 working end of 46 (FIG. 5)
50 casting mass, medium (FIGS. 1, 5 through 7)
51 layer of 50 (FIG. 5)
52 conical element (FIG. 6)
53 cone base of 52 (FIG. 6)
54 narrowed cone end of 52 (FIG. 6)
55 upper layer of 50 (FIG. 6)
56 lower layer of 50 (FIG. 6)
57 electrode of 20 (FIG. 7)
58 breakthrough of 57 (FIG. 7)
59 plane of 57 (FIG. 7)
60 plane of 35 (FIG. 7)

The invention claimed is:

1. Device for triggering of functions in a vehicle, in particular for triggering of a mono directional or bidirectional communication between an authorized person and a vehicle,
   wherein the desired function is effected in the vehicle, and in particular, a lock is unbolted and/or bolted in the vehicle in case of a successful communication,
   with an actuator (10) at the vehicle, wherein the actuator (10) exhibits at least two sensors (20, 30) cooperating with each other in its interior, namely on the one hand a proximity sensor (20) responding upon approach by a person and with a capacitive electrode (21) in the interior of the actuator (10), wherein the capacitive electrode (21) builds up an electrical field in the outer space (42) of the actuator (10),
   and on the other hand a pressure sensor (30) responding to a pressure exertion,
   wherein the pressure measurement member (31) of the pressure sensor is also disposed in the interior of the actuator (10),
   and with a point of attack (43) at the outer side of the actuator (10) serving for manual exertion of pressure (44),
   characterized in that
   the electrode (21) of the proximity sensor (20) exhibits a breakthrough (22),
   wherein the breakthrough (22) is disposed between the point of attack (43) at the actuator (10) and the pressure measurement member (31) of the pressure sensor (30),
   and wherein a pressure transfer agent (50) further conducts (45) a pressure exertion (44) from the point of attack (43) through the breakthrough (22) in the electrode (21) wide area up to the pressure measurement member (31).

2. Device according to claim 1, the wherein the pressure measurement member (31) is disposed in a plane located below the breakthrough (22) with reference to the point of attack (43) at the actuator (10) and wherein the pressure exertion (44) is further led (45) through the breakthrough (22) up to the pressure measurement member (31) disposed remotes to the breakthrough (22) by way of a pressure transfer agent (50).

3. Device according to claim 1, wherein the pressure measurement member (31) is disposed in the plane (60) of the breakthrough (58) furnished in the electrode (57) for in a plane (59) in front of the breakthrough (58) and receives a pressure actuation through the pressure transfer agent (50).

4. Device according to claim 1, wherein the pressure transfer agent comprises a tappet (46).

5. Device according to claim 4, wherein the tappet (46) is seated in the region of the point of attack (43) at the inner wall (47) of the actuator (10), and wherein the tappet (46) is directed toward the pressure measurement member (31) through the breakthrough (22).

6. Device according to claim 4, wherein the tappet is formed as a conical element (52), which conical element (52) is turned to the point of attack at the actuator (10) with its wide area base and wherein the conical element (52) with its conical narrowing (55) points to the pressure measurement member (31).

7. Device according to claim 1, wherein the pressure transfer agent is a medium (50) which fills the space (24) between the point of attack (43), the breakthrough (22) in the electrode (21) and the pressure measurement member (31).

8. Device according to claim 1, wherein a still further bodily transfer agent is also added to the medium (50).

9. Device according to claim 7, wherein the medium (50) is by itself elastically yielding.

10. Device according to claim 7, wherein the medium (50) serving for further conducting (45) of the pressure (44) is essentially incompressible in itself.

11. Device according to claim 7, wherein the medium consists of a casting mass (50).

12. Device according to claim 7, wherein the medium or the casting mass (50) essentially fills the complete receiver (11) in the interior of the actuator (10) and protects against penetrating environmental influences such as humidity.

13. Device according to claim 1, wherein the interior of the actuator (10) has a receiver (11) for an insert (15), wherein the receiver (11) takes the transfer agent or is enveloped by the medium or by the casting mass (50),
   and wherein the insert (15) carries at least the perforated (22) electrode (21) of the proximity sensor (20) and the pressure measurement member of (31) of the pressure sensor (30).

14. Device according to claim 13, wherein the insert (15) accepts at least several electrical device components (41) for the operation of the proximity sensor (20), of the pressure sensor (30) and/or the communication means (41) and/or contains a circuit board (40) for the contacting of these device components (41) and/or of these sensors (20, 30).

15. Device according to claim 13, wherein the insert (15) has a support wall (19), wherein the support wall (19) extends into the interior of the receiver (11) and wherein the two sensors (20, 30), the electrical device components (41) and/or the circuit board (40) are seated at the support wall (19).

16. Device according to claim 1, wherein the actuator (10) is a handle for a door of the vehicle and wherein the receiver in the handle consists of a blind pocket hole (11), wherein the opening (13) of the blind pocket hole (11) is turned toward the one end (12) of the handle and wherein the equipped insert (15) is insertable into the interior of the handle (10) through the opening (13) of the blind pocket hole.

17. Device according to claim 16, wherein the insert (15) has a stopper (16) in the region of the opening (13) of the blind pocket hole (11) and wherein the stopper (16) at least partially closes the opening (13) of the blind pocket hole (11) in case of insertion and wherein the stopper (16) supports itself circumferentially at least point wise at the inner face (17) of the receiver (11).

18. Device according to claim 1, wherein the electrode (21) of the proximity sensor (20) as seen in cross-section comprises an essentially U-shaped angled sheet metal section with two U-legs (26, 27) and a U-middle web (25) connecting the two U-legs (26, 27), and wherein the U-middle web (25) exhibits the breakthrough (22), while the leg ends of the U-webs (26, 27) support themselves at the support wall (19).

19. Device according to claim 18, wherein the pressure measurement member (31) is disposed in the U-interior region.

20. Device according to claim 18, wherein the U-middle web (25) of the electrode (21) is disposed with its breakthrough (22) at a distance (23) from the pressure measurement member (31).

21. Device according to claim 1, wherein the pressure measurement member (31) is formed by a preassembled device unit and wherein the preassembled device unit comprises a conductor foil (32), a piezo element (35) and a spacer (36) at a print plate (37), and wherein the connectors of the conductor foil (32) and of the print plate (37) are connected with the further electrical device components (41) of the pressure sensor (30) through electrical contacts (38, 39).

22. Device according to claim 21, wherein the device unit of the pressure measurement member (31) is seated on a support plate (37)

and wherein the support plate (37) furnished with the sensor (30) and/or electrical device elements (41) is attached at the insert (15) and is contacted (38,39).

23. Device according to claim 21, wherein the conductor foil (32) of the pressure measurement member (31) is turned toward the point of attack (43) of the actuator (10).

24. Device according to claim 21, wherein the conductor foil (32) of the pressure measurement member (31) is a grid work (34) consisting of conductor rods (33) and wherein the grid work (34) contacts the piezo element (35).

25. Device according to claim 21, wherein the conductor foil (32) or the grid work (34) of the conductor foil (32) of the pressure measurement member (31) at the same time is the electrode of the proximity sensor (20) and thus has a double functioning, both as a component of the pressure measurement member (31) as well as also the proximity sensor (20).

* * * * *

UNITED STATES PATENT AND TRADEMARK OFFICE
CERTIFICATE OF CORRECTION

PATENT NO. : 8,416,092 B2
APPLICATION NO. : 12/452244
DATED : April 9, 2013
INVENTOR(S) : Witte et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 590 days.

Signed and Sealed this
Fifteenth Day of October, 2013

Teresa Stanek Rea
*Deputy Director of the United States Patent and Trademark Office*